United States Patent
Suzuki et al.

(10) Patent No.: US 8,895,210 B2
(45) Date of Patent: Nov. 25, 2014

(54) METHOD FOR FABRICATING PELLICLE, PHOTO MASK, AND SEMICONDUCTOR DEVICE

(71) Applicants: Masato Suzuki, Kanagawa-ken (JP); Tetsuro Nakasugi, Kanagawa-ken (JP)

(72) Inventors: Masato Suzuki, Kanagawa-ken (JP); Tetsuro Nakasugi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 13/680,415

(22) Filed: Nov. 19, 2012

(65) Prior Publication Data

US 2013/0130158 A1    May 23, 2013

(30) Foreign Application Priority Data

Nov. 21, 2011    (JP) ................... 2011-253638

(51) Int. Cl.
*G03F 1/62* (2012.01)
*G03F 1/64* (2012.01)
*G03F 1/68* (2012.01)

(52) U.S. Cl.
CPC ... *G03F 1/62* (2013.01); *G03F 1/68* (2013.01)
USPC .............................................................. 430/5

(58) Field of Classification Search
CPC ...................................... G03F 1/62; G03F 1/64
USPC .................................................. 430/5, 322; 428/14
See application file for complete search history.

(56) References Cited

U.S. PATENT DOCUMENTS

2008/0289517 A1* 11/2008 Begon et al. ................. 101/35
2011/0235016 A1*  9/2011 Shirasaki ..................... 355/75

FOREIGN PATENT DOCUMENTS

| JP | 5-188582   | 7/1993 |
| JP | 2011-17833 | 1/2011 |
| JP | 2011-85831 | 4/2011 |

\* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

An aspect of the present embodiment, there is provided a method for fabricating a pellicle, including acquiring a shape of a pellicle frame, deciding a thickness distribution of an adhesive to be coated on the pellicle frame on a basis of the acquired shape of the pellicle frame, and coating the adhesive on the pellicle frame based on the decision of the thickness distribution.

8 Claims, 2 Drawing Sheets

METHOD FOR FABRICATING PELLICLE, PHOTO MASK, AND SEMICONDUCTOR DEVICE

CROSS REFERENCE TO RELATED APPLICATION

This application is based upon and claims the benefit of priority from prior Japanese Patent Application No. 2011-253638, filed on Nov. 21, 2011, the entire contents of which are incorporated herein by reference.

FIELD

Exemplary embodiments described herein generally relate to a method for fabricating a pellicle, a method for fabricating a photo mask and a method for fabricating a semiconductor device.

BACKGROUND

Photolithography is one of important processes in fabricating processing of a semiconductor device. When a foreign material is attached on a photo mask in photolithography, a pattern cannot be precisely transferred. Accordingly, a pellicle is attached on the photo mask to protect a pattern surface of the photo mask. The pellicle has a predetermined distance to the pattern surface of the photo mask. As a result, an image of the foreign material is not transferred in the exposure process even when the foreign material is attached on the pellicle.

However, in a trend of miniaturization of the semiconductor device, distortion of the photo mask after attaching the pellicle has been recognized as a problem. The distortion of the photo mask may be generated due to distortion of a pellicle frame. On the other hand, the photo mask itself may have distortion. Distortion may be generated in the photo mask after the photo mask is chucked on a photo mask chuck of an exposure apparatus.

In such a manner, a pattern cannot be precisely transferred when the exposure process is performed in a state of the photo mask with distortion. Accordingly, a method for transferring precisely a pattern is desirable.

DETAILED DESCRIPTION

Figure 1:
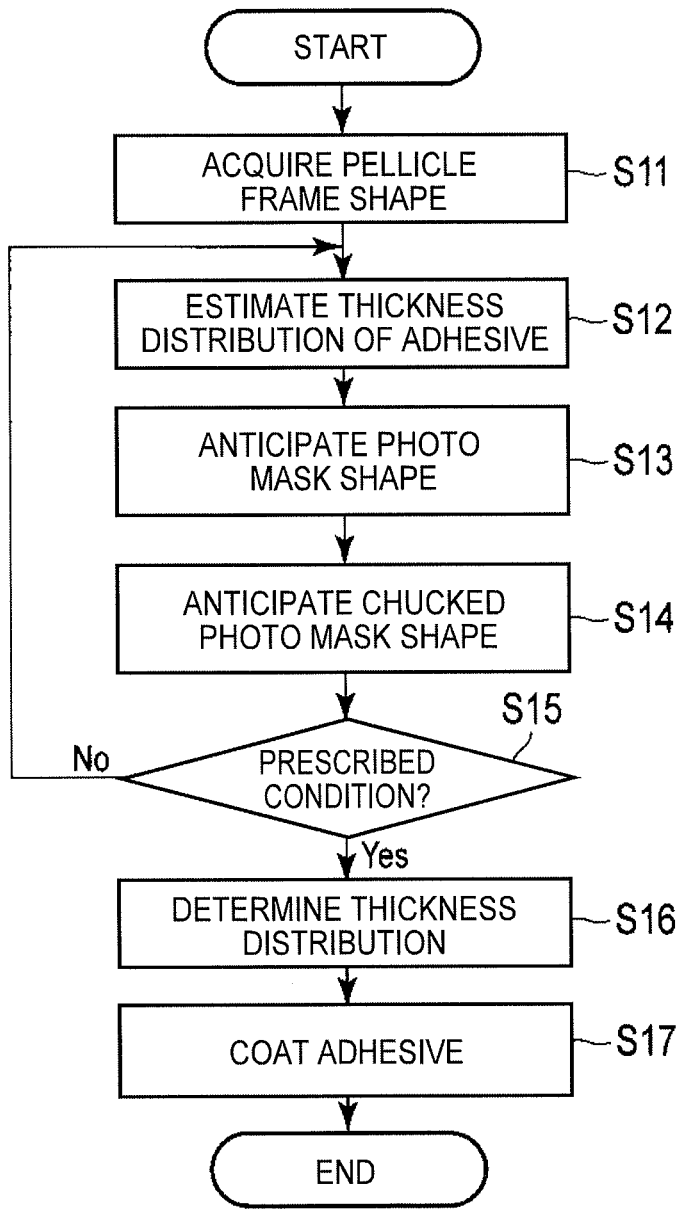
FIG. 1 is a flowchart showing a method for fabricating a pellicle according to an embodiment.

An aspect of the present embodiment, there is provided a method of fabricating a pellicle, including acquiring a shape of a pellicle frame, deciding a thickness distribution of an adhesive to be coated on the pellicle frame on a basis of the acquired shape of the pellicle frame, and coating the adhesive on the pellicle frame based on the decision of the thickness distribution.

Another aspect of the present embodiment, there is provided a method of fabricating a photo mask, including performing an exposure process using the photo mask provided according to the method of fabricating the pellicle mentioned above.

Another aspect of the present embodiment, there is provided a method of fabricating a semiconductor device, including performing an exposure process using the photo mask provided according to the method of fabricating the pellicle mentioned above.

(Embodiment)

Embodiment will be described below in detail with reference to the attached drawings. Throughout the attached drawings, similar or same reference numerals show similar, equivalent or same components. The description of the same or similar parts and elements will be performed in a case for necessity.

FIG. 1 is a flowchart showing a method for fabricating a pellicle according to an embodiment.

A shape of a pellicle frame is measured to acquire the shape of a pellicle frame (S11). Specifically, a distortion distribution in a pellicle frame surface or the like is measured on a basis of the shape of the pellicle frame.

A thickness distribution of an adhesive to be coated on the pellicle frame is estimated on a basis of the shape of the pellicle frame acquired in the step of S11 (S12). In this step, the thickness distribution of the adhesive is estimated on a basis of at least one of the shape of a photo mask itself and the shape of the photo mask chucked on a photo mask chuck in an exposure apparatus. The shape of each photo mask has individual difference and a distortion distribution of the photo mask is originated on the exposure apparatus in this step. Specifically, the thickness distribution of the adhesive is estimated to optimize the shape of the photo mask on which the pellicle is attached as possible. The distortion of the photo mask is minimized as possible, for example. Further specifically, the thickness distribution of the adhesive is estimated to optimize the shape of the photo mask on which the pellicle is attached as possible when the photo mask is chucked on the photo mask chuck in the exposure apparatus.

The shape of the photo mask is anticipated when the pellicle frame is attached on the photo mask in the step S12 by using the adhesive (S13). Specifically, the shape of the photo mask is anticipated on a basis of the shape of the pellicle frame and the shape of the photo mask before attaching the pellicle frame, after the pellicle frame is attached on the photo mask.

The shape of the photo mask is anticipated when the photo mask is chucked on the photo mask chuck (S14). The pellicle frame is attached on the photo mask by using the adhesive having the thickness distribution estimated in the step S12. Specifically, the shape of the photo mask is anticipated by using simulation on a basis of the shape of the photo mask anticipated in the step S13 after attaching the pellicle frame, characteristic of the photo mask chuck, or the like.

The shape of the photo mask anticipated in the step 14, the photo mask is chucked on the photo mask chuck, is decided whether or not the shape is satisfied with a prescribed condition (S15). It is decided whether or not the distortion of the photo mask is fallen within a range of the prescribed distortion.

When the shape of the photo mask is not satisfied with the prescribed condition, a processing step returns the step S12. Accordingly, the thickness distribution of the adhesive to be coated on the pellicle frame is estimated again.

When the shape of the photo mask is satisfied with the prescribed condition, the thickness distribution of the adhesive supposed in the step 12 is finally decided as the thickness distribution of the adhesive (S16).

As mentioned above, the thickness distribution of the adhesive is decided to optimize the shape of the photo mask on which the pellicle is attached. Further specifically, the thickness distribution of the adhesive is decided to optimize the shape of the photo mask on which the pellicle is attached, when the photo mask is chucked on the photo mask chuck in the exposure apparatus.

The adhesive is coated on the pellicle frame on a basis of the thickness distribution decided in the step S16. In other words, the adhesive is coated as precisely as possible to the decided thickness distribution. Meanwhile, the thickness distribution of the adhesive coated on the pellicle can be measured by an optical instrument such as an interferometer or the like.

In such a manner, a region coated with adhesive is coated with a protective tape so that the pellicle is shipped after the adhesive is coated on the pellicle frame.

Figure 2:
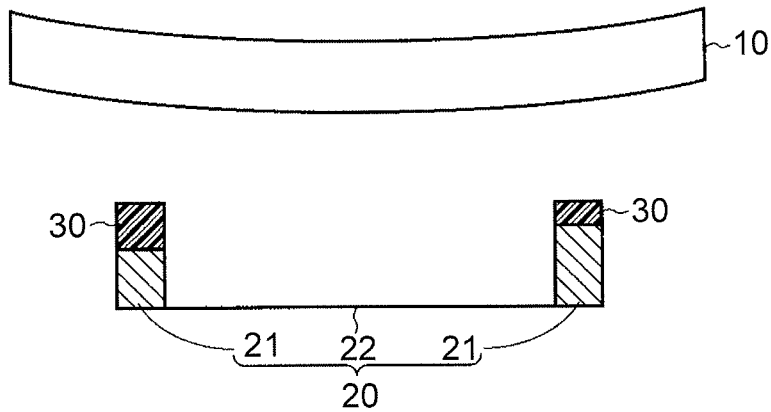
FIG. 2 is cross-sectional view of a mask and a pellicle showing an effect of the embodiment.
Figure 3:
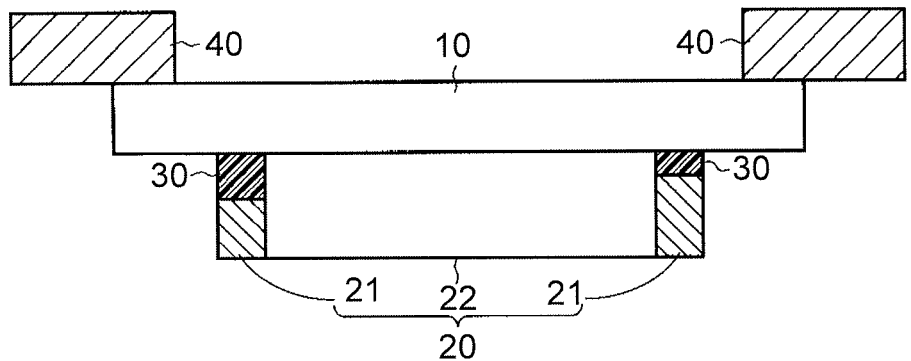
FIG. 3 is a cross-sectional view of a mask with a pellicle showing an effect of the embodiment.

FIGS. 2, 3 are cross-sectional views of a mask and the pellicle showing an effect of the embodiment.

FIGS. 2 is a photo mask 10 showing a state before a pellicle including a pellicle frame 21 and a pellicle film 22 is coated. As shown in FIG. 2, the thickness distribution of an adhesive 30 is decided corresponding to a shape of the photo mask 10 and a shape of the pellicle frame 21. Here, the thickness distribution is a thickness distribution in a plane of the pellicle frame 11.

FIG. 3 is the photo mask 10 showing a state when the photo mask 10 is chucked on the photo mask chuck 40 after the pellicle 20 is attached on the photo mask 10 by the adhesive 30. As shown in FIG. 3, the shape of the photo mask 10 is optimized due to optimization of the thickness distribution of the adhesive 30 when the photo mask 10 is chucked on the photo mask chuck 40. Namely, the distortion of the photo mask 10 is minimized.

As described above, the thickness distribution of the adhesive to be coated on the pellicle frame is decided on a basis of the shape of the pellicle frame, and the adhesive is coated on the pellicle frame on a basis of the decided the thickness distribution according to the embodiment.

In such a manner, the shape of the photo mask, the shape of the photo mask after attaching the pellicle, and further the shape of the photo mask after chucking the photo mask, on which the pellicle is attached, on the photo mask chuck of the exposure apparatus can be optimized, even when the pellicle frame or the photo mask has distortion. As a result, a pattern can be precisely transferred when the pattern is miniaturized. Further, an exposure process having the shape of the photo mask more optimized can be performed in consideration with the shape of the photo mask itself and characteristics of the photo mask chuck.

Figure 4:
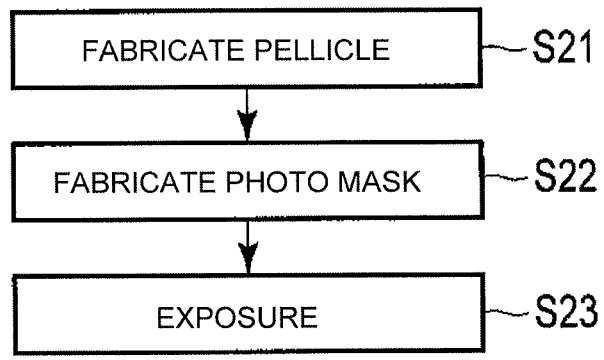
FIG. 4 is a flowchart showing a method for fabricating a photo mask and a semiconductor device according to the embodiment.

FIG. 4 is a flowchart showing a method for fabricating a photo mask using the pellicle fabricated by the above mentioned approach and method for fabricating a semiconductor device.

First, a pellicle coated with the adhesive is fabricated in the processes described above (S21). The pellicle fabricated in the step S21 is attached on the photo mask to fabricate the photo mask with the pellicle (S22). Further, an exposure process is performed using the photo mask fabricated in the step S22 to fabricate a semiconductor device including a semiconductor integrated circuit (S23).

As mentioned above, an optimized photo mask can be fabricated by using the pellicle fabricated by the above method. Further, a semiconductor device with high accuracy can be fabricated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for fabricating a pellicle, comprising:
   acquiring a shape of a pellicle frame;
   deciding a thickness distribution of an adhesive to be coated on the pellicle frame on a basis of the acquired shape of the pellicle frame; and
   coating the adhesive on the pellicle frame on a basis of the decision of the thickness distribution;
   wherein the thickness distribution of the adhesive is decided to optimize a shape of a photo mask on which the pellicle frame is attached in a state that the photo mask is chucked on a photo mask chuck of an exposure apparatus,
   the deciding the thickness distribution of the adhesive includes estimating a thickness of the adhesive to be coated on the pellicle frame, anticipating the shape of the photo mask when the photo mask is coated with adhesive having the estimated thickness distribution, deciding whether or not the anticipated shape of the photo mask is satisfied with a prescribed condition, and deciding the anticipated thickness distribution of the adhesive as a final thickness distribution when the anticipated shape of the photo mask is decided to be satisfied with the prescribed condition.

2. The method of claim 1, wherein the acquiring the shape of the pellicle frame includes measuring a distortion distribution of the pellicle frame in plane on a basis of the shape of the pellicle frame.

3. The method of claim 1, wherein the estimating the thickness distribution of the adhesive includes minimizing a distortion of the photo mask on which the pellicle is attached.

4. The method of claim 1, wherein the estimating the thickness distribution of the adhesive includes minimizing a distortion of the photo mask chucked on the photo mask chuck of the exposure apparatus.

5. The method of claim 1, wherein the anticipating the shape of the photo mask chucked on the photo mask chuck of the exposure apparatus includes simulating the shape of the photo mask.

6. The method of claim 1, wherein the deciding, whether or not the anticipated shape of the photo mask is satisfied with a prescribed condition, includes deciding whether or not the distortion of the photo mask is included in a prescribed range.

7. A method for fabricating a photo mask, comprising:
   attaching a pellicle fabricated according to the method of claim 1 to a photo mask.

8. A method for fabricating a semiconductor device, comprising:
   performing an exposure process using the photo mask provided according to the method of claim 7.

* * * * *